United States Patent
Honda et al.

(10) Patent No.: US 9,981,559 B2
(45) Date of Patent: May 29, 2018

(54) BATTERY CONTROL SYSTEM, AND BATTERY SYSTEM

(71) Applicant: Hitachi, Ltd., Chiyoda-ku, Tokyo (JP)

(72) Inventors: Mitsutoshi Honda, Tokyo (JP); Takanori Yamazoe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 154 days.

(21) Appl. No.: 15/109,500

(22) PCT Filed: Feb. 14, 2014

(86) PCT No.: PCT/JP2014/053498
§ 371 (c)(1),
(2) Date: Jul. 1, 2016

(87) PCT Pub. No.: WO2015/121979
PCT Pub. Date: Aug. 20, 2015

(65) Prior Publication Data
US 2016/0325626 A1 Nov. 10, 2016

(51) Int. Cl.
*B60L 1/00* (2006.01)
*B60L 3/12* (2006.01)
(Continued)

(52) U.S. Cl.
CPC .............. *B60L 3/12* (2013.01); *B60L 3/0046* (2013.01); *B60L 11/1853* (2013.01);
(Continued)

(58) Field of Classification Search
CPC .......... H01M 2010/4271; H01M 10/42; B60L 11/1853; B60L 3/12; B60L 2210/30;
(Continued)

(56) References Cited

U.S. PATENT DOCUMENTS

| 8,941,354 B2* | 1/2015 | Song | H04Q 9/00 320/116 |
|---|---|---|---|
| 2013/0082641 A1* | 4/2013 | Nishibayashi | H02J 3/32 320/106 |

(Continued)

FOREIGN PATENT DOCUMENTS

| JP | 2012-222913 A | 11/2012 |
|---|---|---|
| JP | 2012-244724 A | 12/2012 |

(Continued)

OTHER PUBLICATIONS

International Search Report (PCT/ISA/210) issued in PCT Application No. PCT/JP2014/053498, dated Apr. 15, 2014 with English-language translation (four (4) pages).

(Continued)

*Primary Examiner* — Jared Fureman
*Assistant Examiner* — Duc M Pham
(74) *Attorney, Agent, or Firm* — Crowell & Moring LLP

(57) ABSTRACT

The present invention has an object to provide a battery control system which can immediately notify an abnormality to a battery system controller when a battery abnormality occurs. The battery control system according to the invention includes a first communication unit which transmits battery data using a first radio frequency and a second communication unit which transmits abnormality data using a second radio frequency. The first communication unit transmits the battery data at a predetermined period. The second communication unit transmits the abnormality data when the battery abnormality is detected.

11 Claims, 9 Drawing Sheets

(51) Int. Cl.
*H01M 10/42* (2006.01)
*H02J 7/02* (2016.01)
*G01R 31/36* (2006.01)
*B60L 11/18* (2006.01)
*B60R 16/033* (2006.01)
*B60L 3/00* (2006.01)
*H02J 7/00* (2006.01)
*H02J 13/00* (2006.01)

(52) U.S. Cl.
CPC ....... *B60L 11/1861* (2013.01); *B60L 11/1864* (2013.01); *B60R 16/033* (2013.01); *G01R 31/3627* (2013.01); *G01R 31/3689* (2013.01); *H01M 10/42* (2013.01); *H02J 7/0026* (2013.01); *H02J 7/02* (2013.01); *H02J 13/0003* (2013.01); B60L 2210/30 (2013.01); H01M 2010/4271 (2013.01); H01M 2010/4278 (2013.01); Y02T 10/705 (2013.01); Y02T 10/7011 (2013.01); Y02T 10/7044 (2013.01); Y02T 10/7241 (2013.01); Y02T 90/16 (2013.01)

(58) Field of Classification Search
CPC ...... G01R 31/3689; H02J 7/02; B60R 16/033; Y02T 10/7044; Y02T 90/16
See application file for complete search history.

(56) References Cited

U.S. PATENT DOCUMENTS

| | | | | |
|---|---|---|---|---|
| 2013/0260198 | A1* | 10/2013 | Yokoura | H01M 6/5011 |
| | | | | 429/91 |
| 2015/0028816 | A1* | 1/2015 | Lee | H02J 7/0021 |
| | | | | 320/134 |
| 2016/0294019 | A1* | 10/2016 | Yamauchi | H02J 7/02 |

FOREIGN PATENT DOCUMENTS

| | | |
|---|---|---|
| JP | 2013-78233 A | 4/2013 |
| JP | 2013-115939 A | 6/2013 |
| JP | 2013-140055 A | 7/2013 |
| JP | 2013-207945 A | 10/2013 |
| JP | 2013-541320 A | 11/2013 |
| WO | WO 2012/061262 A1 | 5/2012 |

OTHER PUBLICATIONS

Japanese-language International Preliminary Report on Patentability (PCT/IPEA/409) issued in PCT Application No. PCT/JP2014/053498, dated Nov. 2, 2015 (four (4) pages).

* cited by examiner

BATTERY CONTROL SYSTEM, AND BATTERY SYSTEM

TECHNICAL FIELD

The present invention relates to a system which controls a battery.

BACKGROUND ART

Recently, while global environment problems are attracting attentions intensively, there is required a reduction in emission of greenhouse gases in every fields in order to prevent global warming. A gasoline-engine automobile considered as the largest emission source of the greenhouse gases comes to be replaced with a hybrid electric automobile and an electric automobile.

A large-scale secondary battery used as a power source of the hybrid automobile and the electric automobile is required for a high power and a large capacity. Therefore, a storage battery module equipped in the large-scale secondary battery is configured by connecting a plurality of battery cells in series and parallel.

A lithium ion battery as the secondary battery is required to be appropriately handled in order to prevent a high-voltage charge and to prevent degradation in performance due to an overdischarge. Therefore, the battery module mounted in the hybrid automobile or the electric automobile is provided with a battery management device which detects voltage, current, and temperature as a battery status. A battery system controller receives a notification on the battery status from the battery management device, and controls the battery according to the battery status.

When being overcharged or excessively increased in temperature, the lithium ion battery is significantly degraded in performance, and there is also increased a risk of fire or explosion. Therefore, when the overcharge and the excessive temperature rise are detected, it is necessary to take a measure such as immediately disconnecting the battery from an external circuit. It is considered that a configuration to immediately notify an abnormal status of the battery to the battery system controller as described above is important.

PTL 1 discloses a technique in which a communication system for a normal communication and a communication system for an abnormality notification are provided between controllers of non-contact power transmission apparatus. In a case where the technique disclosed in PTL 1 is used in a battery control system, it may be considered that a first communication path for the normal communication and a second communication path for the notification of a battery abnormality are provided between the battery management device and the battery system controller. When an abnormality occurs in the battery monitored by the battery management device, the abnormality is notified to the battery system controller using the second communication path.

CITATION LIST

Patent Literature

PTL 1: Japanese Patent Publication (Kokai) No. 2013-115939 A

SUMMARY OF INVENTION

Technical Problem

PTL 1 may assume that one-to-one communication is performed between the controllers. On the other hand, the battery control system is provided with a plurality of battery management devices in correspondence with a plurality of batteries. Therefore, the battery system controller and the battery management device can make a one-to-N (plural) communication. Therefore, in a case where the plurality of battery management devices simultaneously notify the battery abnormality to the battery system controller, the communications may mutually interfere specifically in a system where the battery abnormality is notified through radio communication.

In order to prevent such an interference described above, it is considered that the system is configured to divide a communication period into a plurality of time slots and assign the respective battery management devices with different time slots, and the respective battery management devices notify the battery abnormality at every predetermined period. However, in this configuration, even when the battery management device detects the battery abnormality, there is a need to wait the coming time slot which is assigned in advance. Therefore, there is a possibility that the detected battery abnormality is not possible to be immediately notified to the battery system controller.

The invention has been made in view of the above problems, and an object thereof is to provide a battery control system which can immediately notify a battery abnormality to a battery system controller when the abnormality occurs.

Solution to Problem

The battery control system according to the invention includes a first communication unit which transmits battery data using a first radio frequency and a second communication unit which transmits abnormality data using a second radio frequency. The first communication unit transmits the battery data at a predetermined period. The second communication unit transmits the abnormality data when the battery abnormality is detected.

Advantageous Effects of Invention

According to a battery control system in the invention, a battery abnormality can be immediately notified to a battery system controller. Therefore, it is possible to improve stability.

DESCRIPTION OF EMBODIMENTS

First Embodiment

Figure 1:
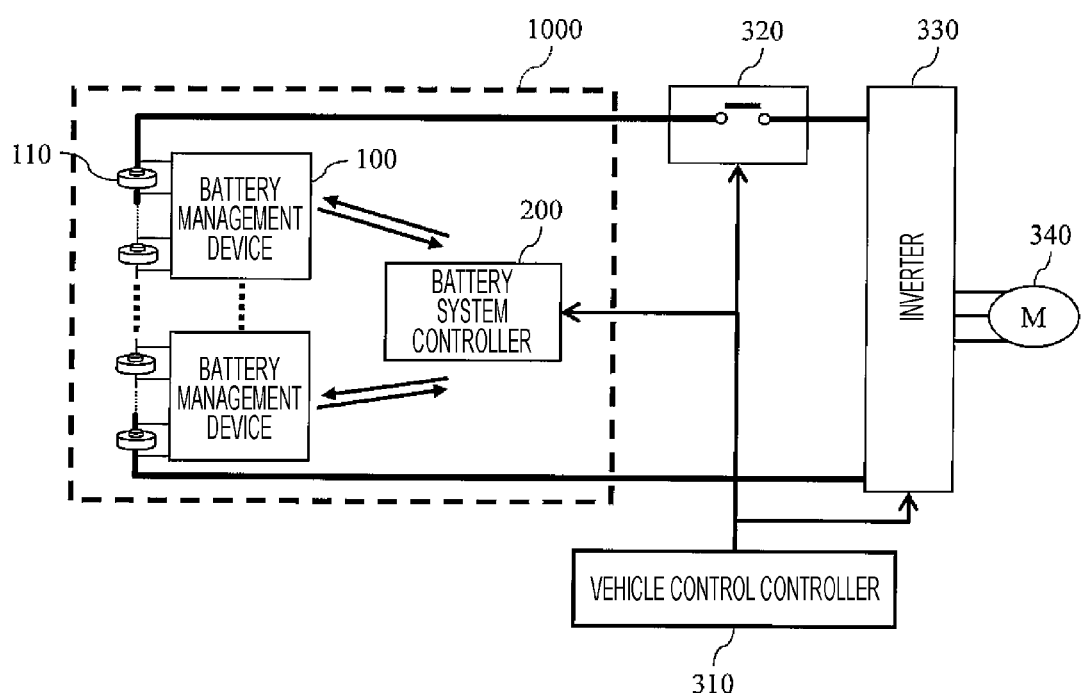
FIG. 1 is a diagram illustrating a configuration of a battery system 1000.

FIG. 1 is a diagram illustrating a configuration of a battery system 1000. The battery system 1000 is a system which is mounted, for example, in a hybrid automobile and an electric automobile, and provides power to the automobile. The battery system 1000 is connected to a vehicle control controller 310. The vehicle control controller 310 acquires information on the status of a battery 110 from the battery system 1000, and instructs the battery system 1000 to control the battery 110 according to the status. In addition, the vehicle control controller 310 controls vehicle devices such as a relay switch 320 and an inverter 330. The inverter 330 drives a motor 340.

The battery management device 100 is connected to one or more batteries 110, and detects the status of the battery 110 (voltage, current, temperature, etc.). The battery management device 100 performs radio communication with a battery system controller 200, and transmits the detected battery data (data which describes a battery status) to the battery system controller 200 by radio. The battery system controller 200 calculates a state of charge (SOC) and a state of health (SOH) using the acquired battery data, and notifies the calculation result to the vehicle control controller 310.

Figure 2:
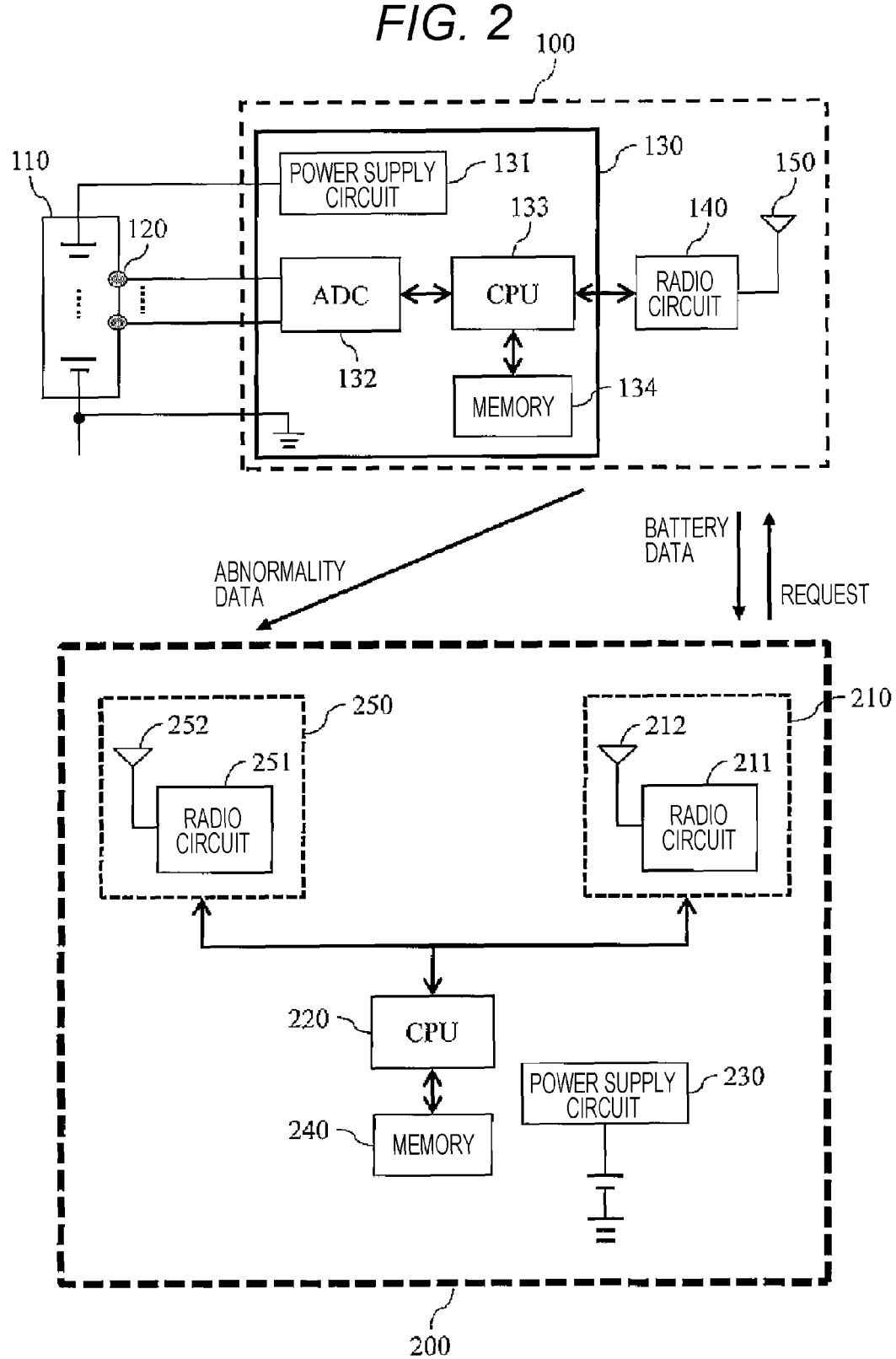
FIG. 2 is a diagram illustrating a detailed configuration of the battery management device 100 and a battery system controller 200.

FIG. 2 is a diagram illustrating a detailed configuration of the battery management device 100 and the battery system controller 200. Hereinafter, the description will be made about the configuration of each device according to FIG. 2. Further, since the configuration of each battery management device 100 is the same, only a single one of the battery management device 100 is illustrated in FIG. 2.

The battery management device 100 is provided with a sensor 120, a calculation unit 130, a radio circuit 140, and an antenna 150. The sensor 120 is provided in every single or plurality of batteries to measure the status of the battery 110. The calculation unit 130 acquires the status of the battery 110 measured by the sensor 120. The radio circuit 140 transmits the battery data which describes the status of the battery 110 or abnormality data which describes an abnormality of the battery 110 through the antenna 150.

The calculation unit 130 is provided with a power supply circuit 131, an A/D converter 132, a processor (CPU: Central Processing Unit) 133, and a memory 134. The power supply circuit 131 receives power from a single or a plurality of batteries 110 and generates an operation voltage. The A/D converter 132 detects the status of a single or a plurality of batteries 110 on the basis of the battery status detected by the sensor 120. The processor 133 diagnoses the status of a signal or a plurality of batteries 110 on the basis of the battery status detected by the A/D converter 132. The memory 134 stores individual identification data of the battery 110, detection data describing the battery status detected by the A/D converter 132, and diagnosis data describing a diagnosis result of the processor 133.

The battery system controller 200 is provided with transmission/reception circuits 210 and 250, a processor (CPU) 220, a power supply circuit 230, and a memory 240. The transmission/reception circuits 210 and 250 are connected to the processor 220. The power supply circuit 230 supplies power using a built-in battery or an external power supply. The memory 240 stores data processed by the processor 220. The transmission/reception circuit 210 is provided with a radio circuit 211 and an antenna 212, and a transmission/reception circuit 250 is provided with a radio circuit 251 and an antenna 252.

The battery system controller 200 performs the radio communication with the battery management device 100, and acquires the battery data describing the status of the battery 110 which is detected by the battery management device 100. In addition, when detecting an abnormality of the battery 110, the battery management device 100 acquires the abnormality data describing that fact through the radio communication. In the radio communication between the battery management device 100 and the battery system controller 200, the battery system controller 200 serves as a master, and the battery management device 100 serves as a slave. The battery management device 100 acquires the status of the battery 110 according to a request from the battery system controller 200, and transmits the battery data to the battery system controller 200.

Figure 3:
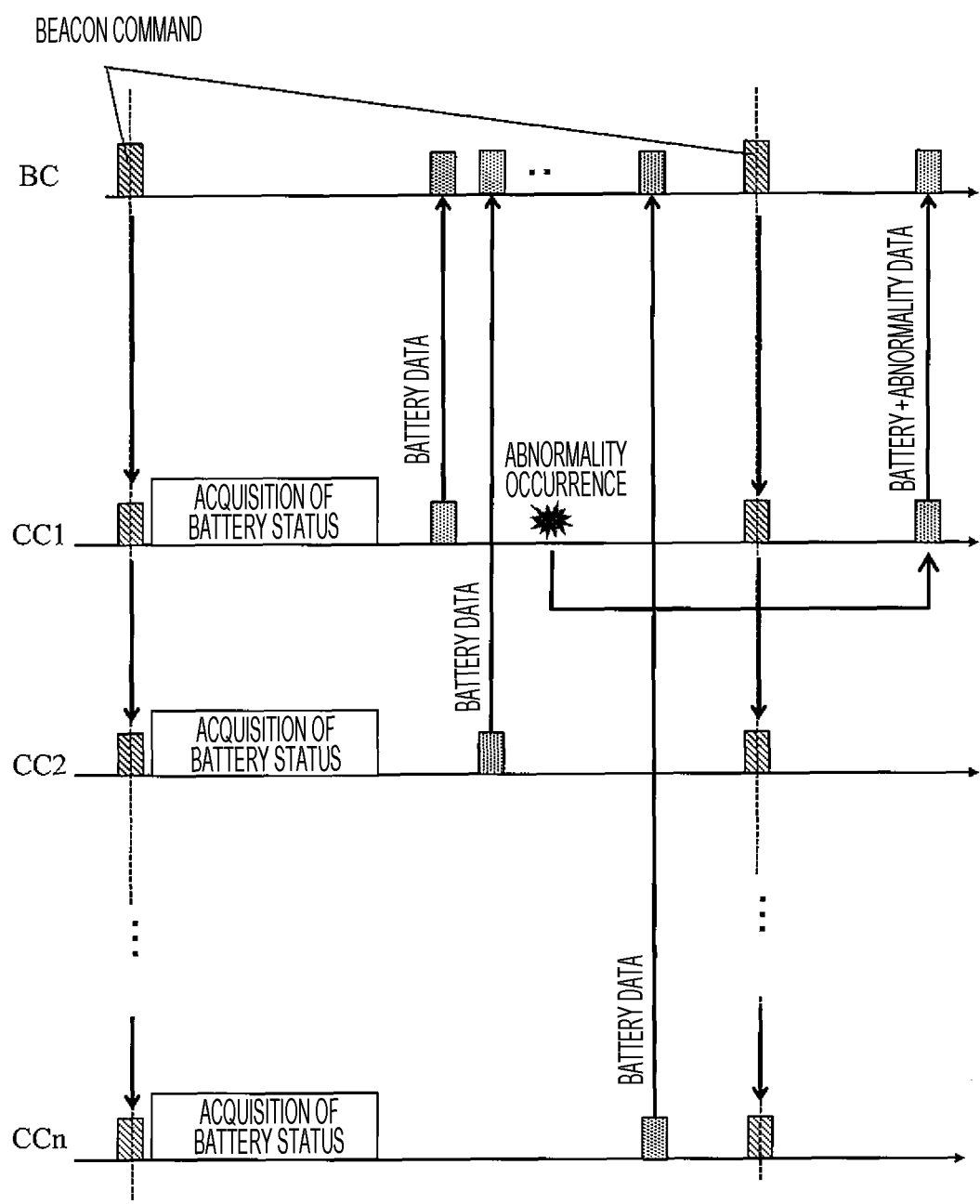
FIG. 3 is a timing chart illustrating a radio communication sequence between the battery system controller 200 and the battery management device 100.

FIG. 3 is a timing chart illustrating a radio communication sequence between the battery system controller 200 and the battery management device 100. Herein, a communication period is divided into a plurality of time slots. Each battery management device 100 is assumed to be differently assigned with a time slot in advance. There are n battery management devices 100 which are denoted by symbols CC1 to CCn. The battery system controller 200 is denoted by a symbol BC.

The BC transmits a request (beacon command) instructing the acquisition of the status of each battery 110 to the respective CCs in a predetermined time slot all at once. Each CC receiving the beacon command acquires the status of the battery 110 connected thereto. When it comes to a time slot assigned to each battery management device 100, the battery management device 100 transmits the battery data using a frequency F1 to a transmission/reception device 210 of the battery system controller 200. Since the communication performed by each CC is divided into the time slots, each CC can notify the battery data of each battery 110 to the BC through the radio communication without causing interference in the radio communication of another CC.

On the other hand, when a lithium ion battery is continuously charged and discharged, there may occur an abnormality such as an overvoltage and an excessive temperature rise. When such a status keeps going on, a risk of fire or explosion is increased. Therefore, when detecting an abnormality such as the overvoltage and the excessive temperature rise of the battery 110, the CC necessarily notifies the abnormality data describing that fact to the BC at once in order to immediately disconnect the subject battery 110 from the battery system 1000. In a case where the abnormality data is assumed to be transmitted from the CC to the BC according to the timing chart illustrated in FIG. 3, the abnormality data is not possible to be transmitted until it comes to the time slot assigned to each CC. Therefore, a delay occurs as that much.

In this first embodiment, in order to avoid such a delay in the notification of the abnormality data, there is provided a mechanism which can cause the CC detecting an abnormality of the battery 110 to immediately notify the abnormality data to the BC.

Figure 4:
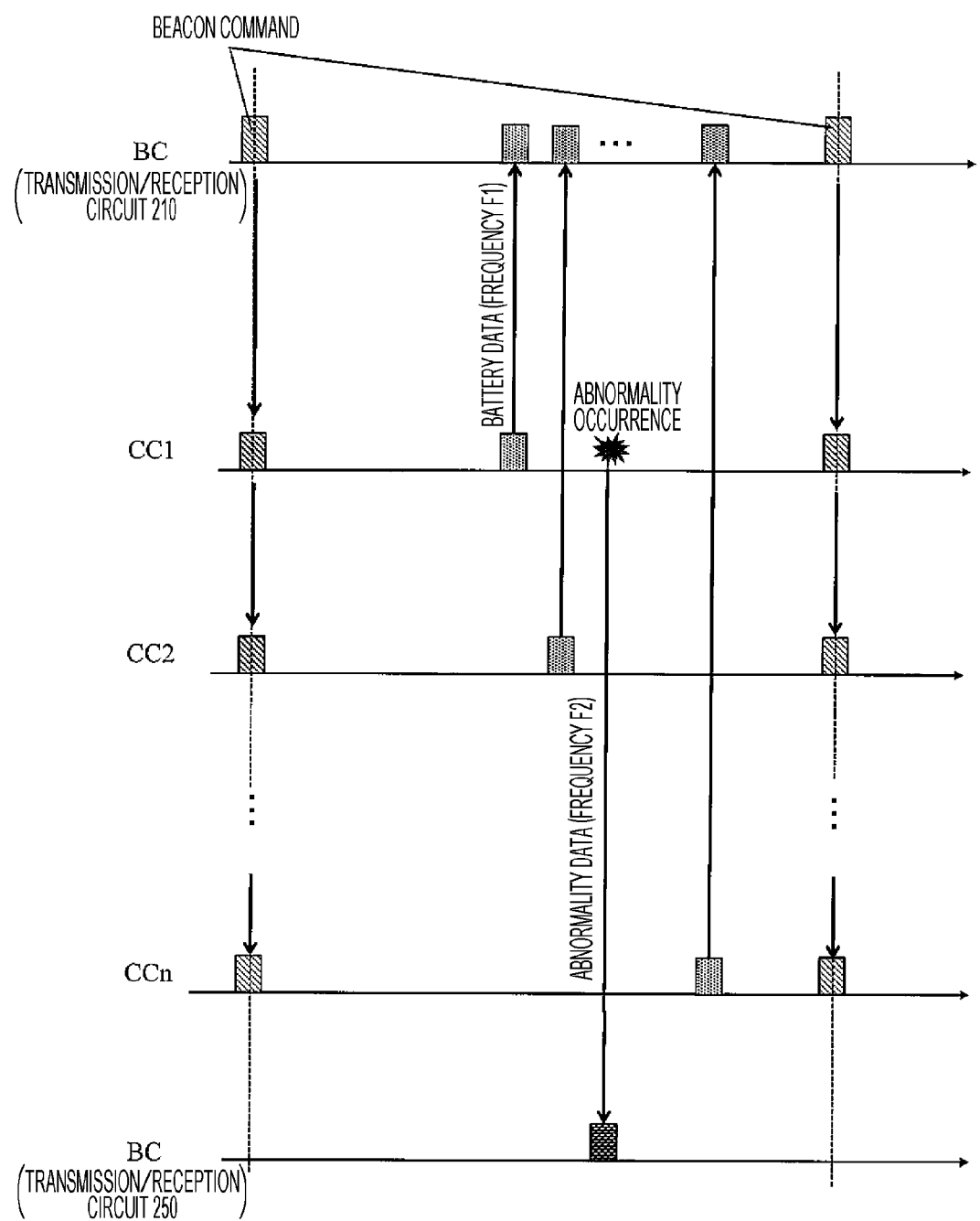
FIG. 4 is a timing chart of the radio communication between BC and CC when CC detects an abnormality of a battery 110 in a first embodiment.

FIG. 4 illustrates an exemplary timing chart of the radio communication between the BC and the CC when the CC detects an abnormality of the battery 110 in this first embodiment. The CC1 is assumed to detect an abnormality of the battery 110 which is connected thereto. The CC1 transmits the abnormality data describing the abnormal status to the transmission/reception circuit 250 at a frequency F2 (different from the frequency F1). The transmission/reception circuit 250 receives the abnormality data at the frequency F2. The CPU 220 recognizes a battery abnormality detected by the CC1 on the basis of the abnormality data.

Since the frequency F1 used for transmitting the battery data is different from the frequency F2 used for transmitting the abnormality data, there is no problem in whether the time slot used by the CC1 to transmit the battery data is overlapped with a time for transmitting the abnormality data. Therefore, when the battery abnormality is detected, the CC1 can immediately transmit the abnormality data without waiting for the time slot for transmitting the battery data. With this configuration, the battery system controller 200 can recognize the battery abnormality detected by the CC1 in early stage.

Figure 5:
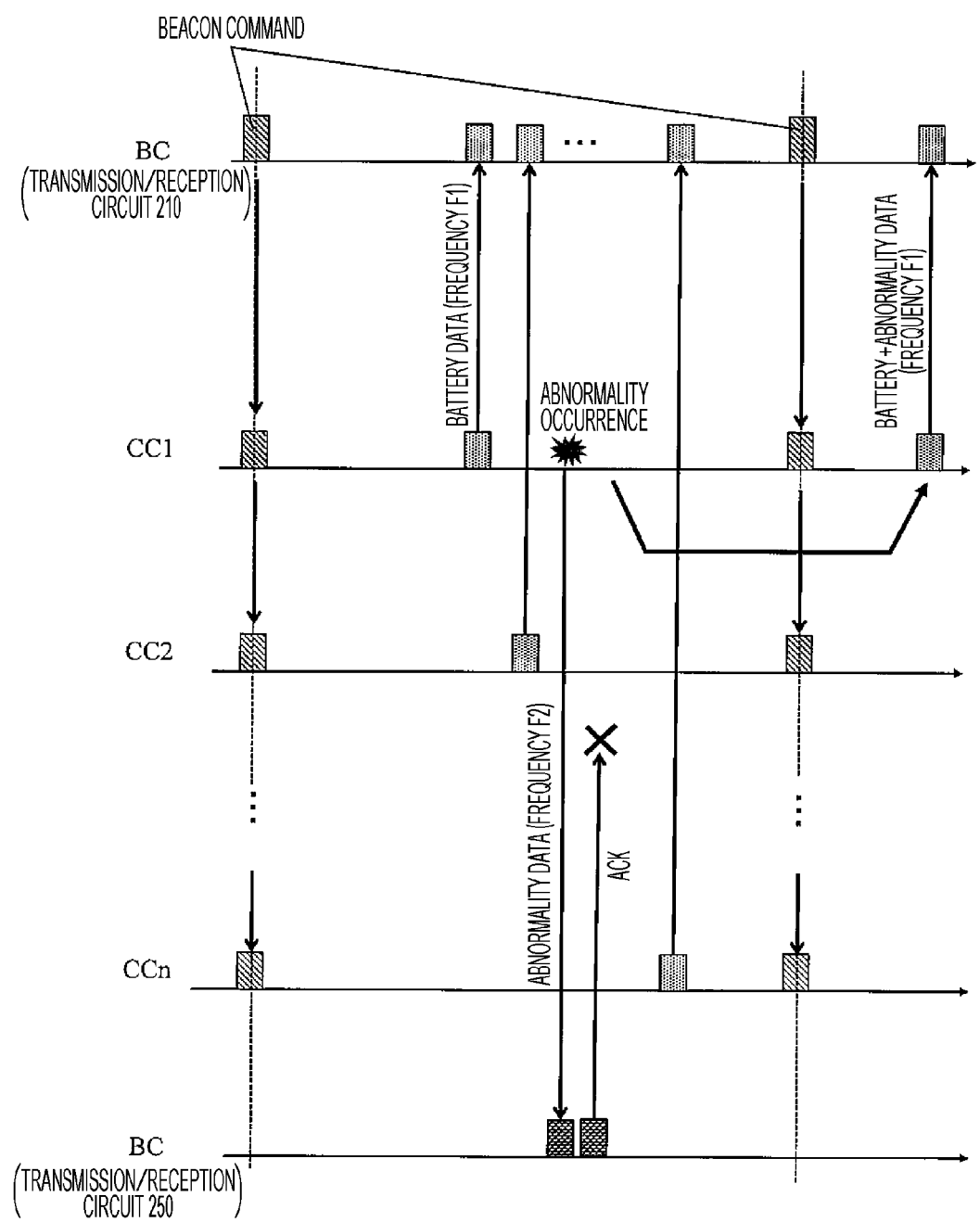
FIG. 5 is a diagram illustrating a modification of the time chart illustrated in FIG. 4.

FIG. 5 is a diagram illustrating a modification of the time chart illustrated in FIG. 4. When receiving the abnormality data from the battery management device 100 (the CC1 in FIG. 5), the transmission/reception circuit 250 transmits an acknowledgement (ACK) in response thereto. In a case where the ACK is received from the transmission/reception circuit 250 after transmitting the abnormality data, the CC1 completes a process for the abnormality data and then returns to a normal operation. In a case where the ACK is not received, there may be a possibility that a communication line between the transmission/reception circuit 250 and the CC1 is not normally operated. Therefore, the abnormality data is transmitted to the transmission/reception circuit 210 in place of the transmission/reception circuit 250. Specifically, at the time slot where the battery data is transmitted, the battery data and the abnormality data are transmitted to the transmission/reception circuit 210 using the frequency F1.

As a method of determining whether the battery management device 100 receives the ACK from the transmission/reception circuit 250, for example, there may be considered: (a) in a case where a predetermined time elapses on standby after the abnormality data is sent, and the ACK is not received within the elapsed time, it is determined that it fails in receiving the ACK; and (b) in a case where the ACK is not received in (a), the same process is repeatedly performed by a predetermined number of times, and in a case where the ACK is still not received, it is determined that it fails in receiving the ACK.

According to the time chart illustrated in FIG. 5, the ACK reception is confirmed to determine whether the communication line between the battery management device 100 and the transmission/reception device 250 is normally operated. Then, the abnormality data can be notified to the battery system controller 200. Therefore, while there is caused more or less delay, even in a case where the same communication line is not normally operated, the abnormality data can be notified for sure using the frequency F1.

Figure 6:
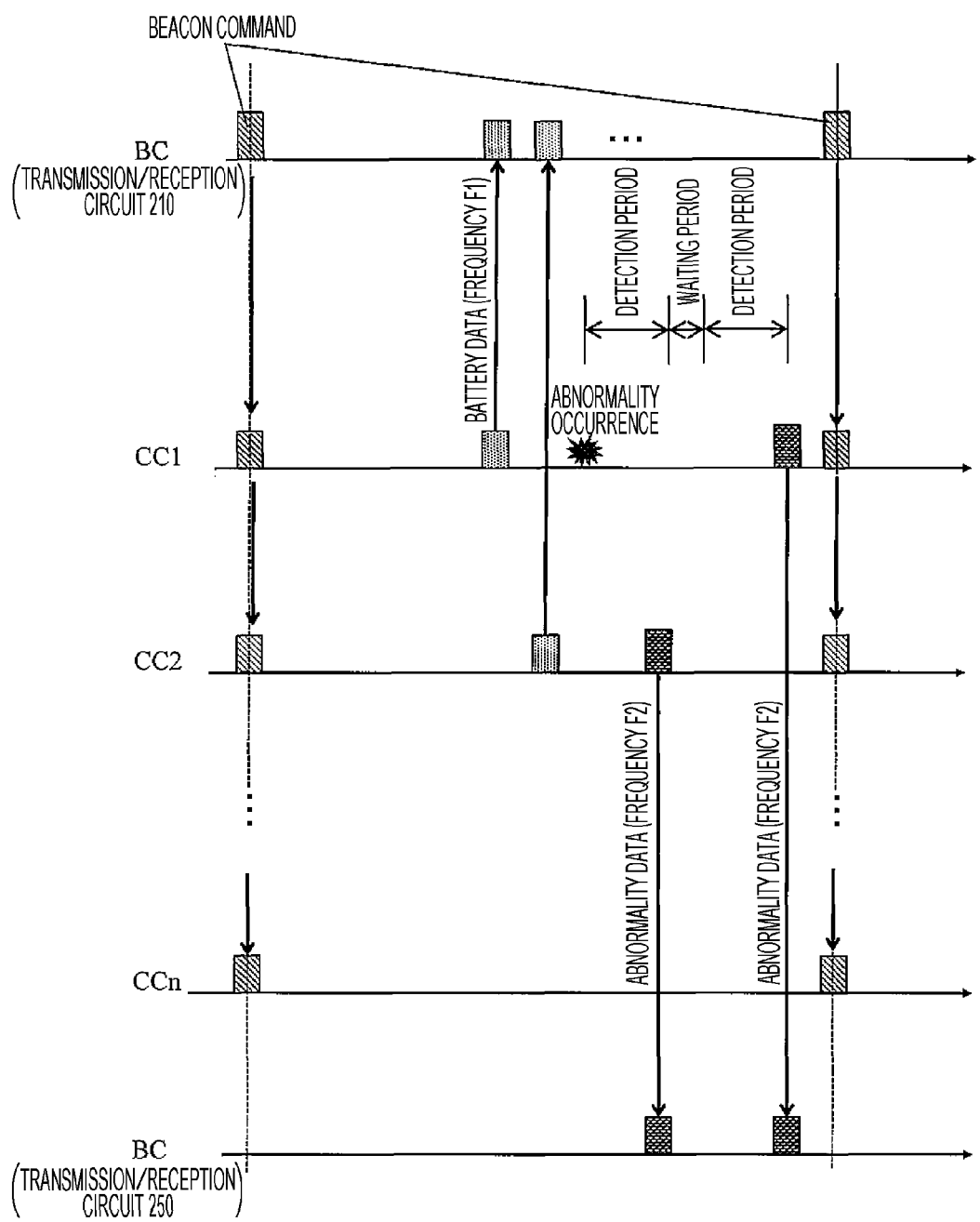
FIG. 6 is a diagram illustrating a modification of the time chart illustrated in FIG. 4.

FIG. 6 is a diagram illustrating a modification of the time chart illustrated in FIG. 4. When the battery management device 100 (the CC1 in FIG. 6) detects an abnormality of the battery 110, it is determined whether another CC is transmitting the abnormality data before transmitting the abnormality data. For example, the radio circuit 140 is set to be a reception state for a predetermined time (the detection period in FIG. 6) using the frequency F2 and a reception intensity of the frequency F2 is measured, so that it is determined whether another CC performs the communication using the frequency F2. In a case where it is detected that the other CC performs the communication using the frequency F2 (in FIG. 6, the CC2 is under communication), it is determined again whether a still other CC performs the communication using the frequency F2 after a time (a waiting time in FIG. 6) necessary for the other CC to transmit the abnormality data. The CC1 repeatedly performs the same process, and transmits the abnormality data at the time of confirming that no other CC performs the communication using the frequency F2. Therefore, it is possible to avoid the interference in radio communication using the frequency F2 for transmitting the abnormality data.

According to the time chart illustrated in FIG. 6, even in a case where the plurality of battery management devices 100 detect an abnormality of the battery 110 at the same or proximate timing, the interference in radio communication for transmitting the abnormality data can be avoided. The abnormality data of each battery 110 can be notified to the battery system controller 200 for sure.

The battery system controller 200 notifies the abnormality data of the battery 110 to a host vehicle control controller 310. When receiving the abnormality data, the vehicle control controller 310 takes an action: (a) operate the relay switch 320 to disconnect the current flowing to the battery 110; or (b) change the frequency of the inverter 330, so that the energizing current to the abnormal battery 110 is restricted. Therefore, it is possible to improve stability of the battery system 1000.

In this first embodiment, the description has been made about an example of the battery system 1000 which is mounted in a vehicle. The battery system 1000 according to this first embodiment may be applied even to an industrial storage battery apparatus. In addition, the description in this first embodiment has been made about an example using the lithium ion battery as a secondary battery, but the invention is not limited to the lithium ion battery. This first embodiment may be applied even to a case where other types of secondary batteries such as a nickel hydrogen battery and a lead battery are used. These matters are common in the following embodiments.

Second Embodiment

Figure 7:
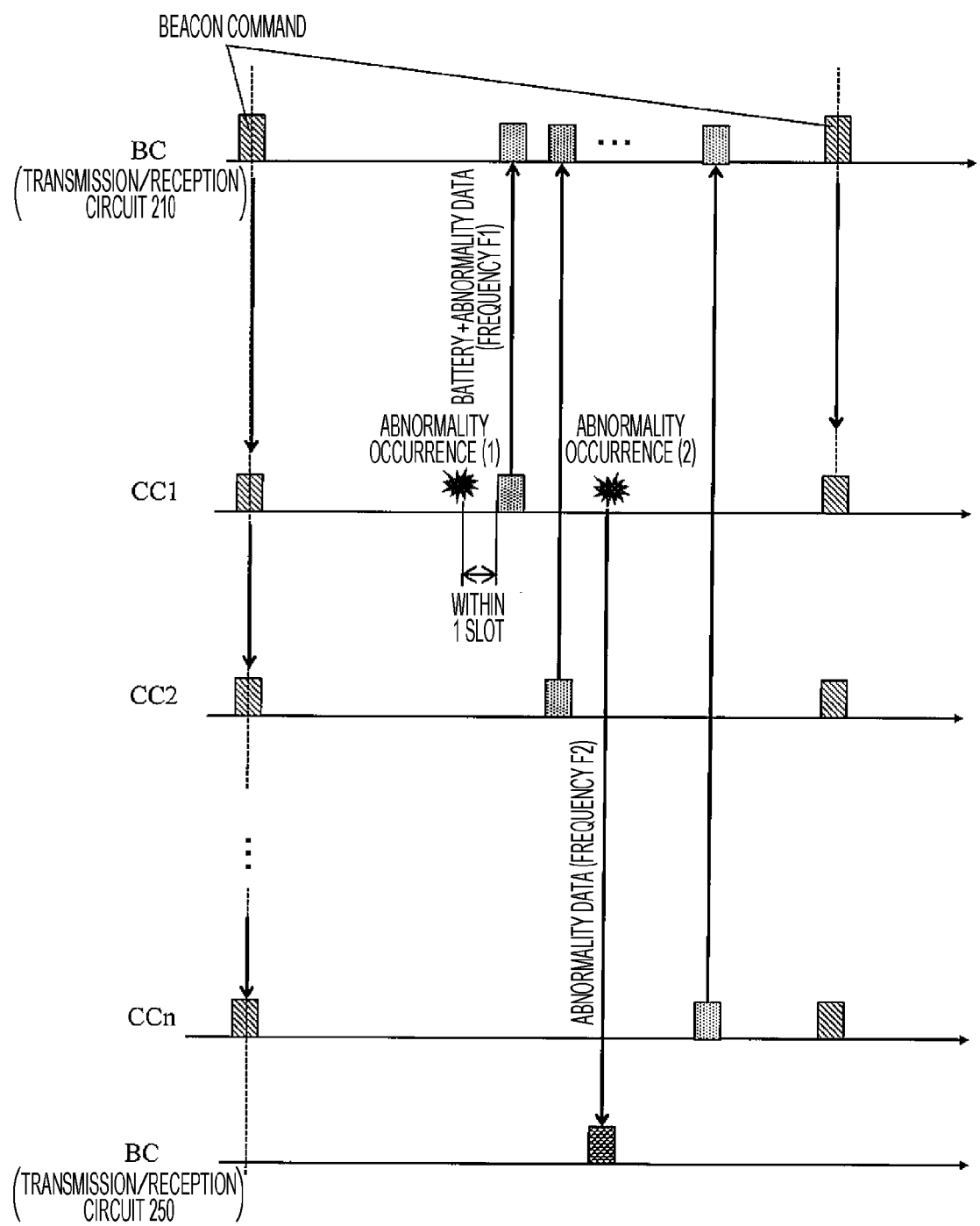
FIG. 7 is a timing chart illustrating a radio communication sequence between the battery system controller 200 and the battery management device 100 in a second embodiment.

FIG. 7 is a timing chart illustrating a radio communication sequence between the battery system controller 200 and the battery management device 100 in a second embodiment of the invention. Since the configuration of the battery system 1000 is the same as that of the first embodiment, the description hereinafter will be made focusing on a difference relating to FIG. 7.

In this second embodiment, before the abnormality data is transmitted, the battery management device 100 (the CC1 in FIG. 7) confirms a time taken for the next time slot for transmitting the battery data. In a case where the time falls within a predetermined time (for example, within one time slot), there is generated no delay so much even when the abnormality data is transmitted using the time slot. It is also desirable from a viewpoint of efficiency in transmission. In such a case, the CC1 transmits the abnormality data at a predetermined time slot together with the battery data using the frequency F1. In a case where the time taken for the next time slot for transmitting the battery data exceeds a predetermined time, the abnormality data is transmitted through the same method as that of the first embodiment.

In a case where the coming time of the next time slot for transmitting the battery data falls within the predetermined time, when the abnormality data is transmitted using the frequency F2 without using the time slot, there is a possibility that the radio circuit 140 and the antenna 150 are occupied for that reason and thus the battery data may not be transmitted. Therefore, since the BC transmitting the beacon command is not possible to normally receive the battery data, there may be a possibility to determine that an abnormality occurs in the CC1. The method of this second embodiment is useful even from this viewpoint of avoiding an erroneous determination.

Third Embodiment

In the first and second embodiments, the battery system controller 200 transmits the beacon command to request the battery data from the battery management device 100. The time slot for transmitting the beacon command can be defined in advance. In this configuration, in a case where the battery management device 100 detects an abnormality of the battery 110 at a time immediately before the battery system controller 200 transmits the beacon command, and when the abnormality data is immediately transmitted, the radio circuit 140 and the antenna 150 are occupied for that reason. Therefore, there is a possibility that the beacon command to be normally received is not received. In a third embodiment of the invention, the description will be made about an exemplary configuration in which the abnormality data can be notified for sure even in such a situation.

Figure 8:
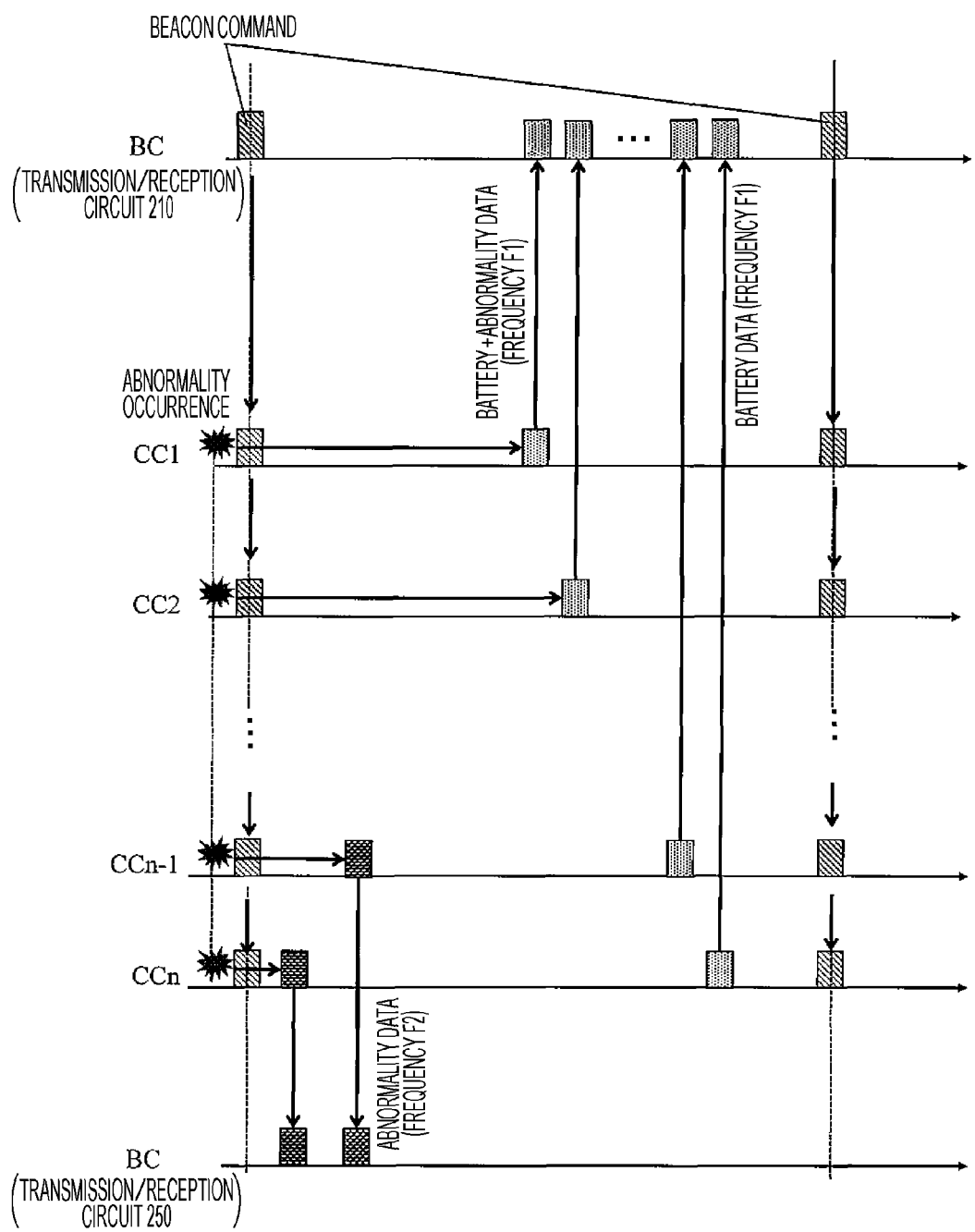
FIG. 8 is a timing chart illustrating a radio communication sequence between the battery system controller 200 and the battery management device 100 in a third embodiment.

FIG. 8 is a timing chart illustrating a radio communication sequence between the battery system controller 200 and the battery management device 100 in this third embodiment. In FIG. 8, there occur abnormalities in the plurality of batteries 110 immediately before the beacon command is transmitted as described above. In order to avoid the interference when the respective CCs transmit the abnormality data, a certain CC transmits the abnormality data at its time slot together with the battery data using the frequency F1, and the other CC transmits the abnormality data using the frequency F2.

Regarding the frequency F1, in order to transmit the abnormality data as soon as possible, it may be desirable that the CC of which the time assigned to the time slot is earlier transmit the abnormality data using the frequency F1. In FIG. 8, since the CC1 and the CC2 are earlier than the other CCs in an order of the assigned time slots, the abnormality data is transmitted at their time slots using the frequency F1. However, the configuration that any CC uses the frequency F1 is not limited to the above. For example, it may be configured such that an odd-numbered CC uses the frequency F1 and an even-numbered CC uses the frequency F2.

The other CCs using the frequency F2 (the CCn-1 and the CCn in FIG. 8) immediately transmit the abnormality data in principle. However, it is desirable that the abnormality data be transmitted while avoiding the time slot at which the beacon command is received (the known time slot assigned in advance). In addition, there is a need to consider that the radio communication of the other CCs does not interfere in the communication using the frequency F2. For example, the respective CCs may use an appropriate method other than the method described in FIG. 6 in order not to cause the interference in the communication of the abnormality data using the frequency F2.

Fourth Embodiment

Figure 9:
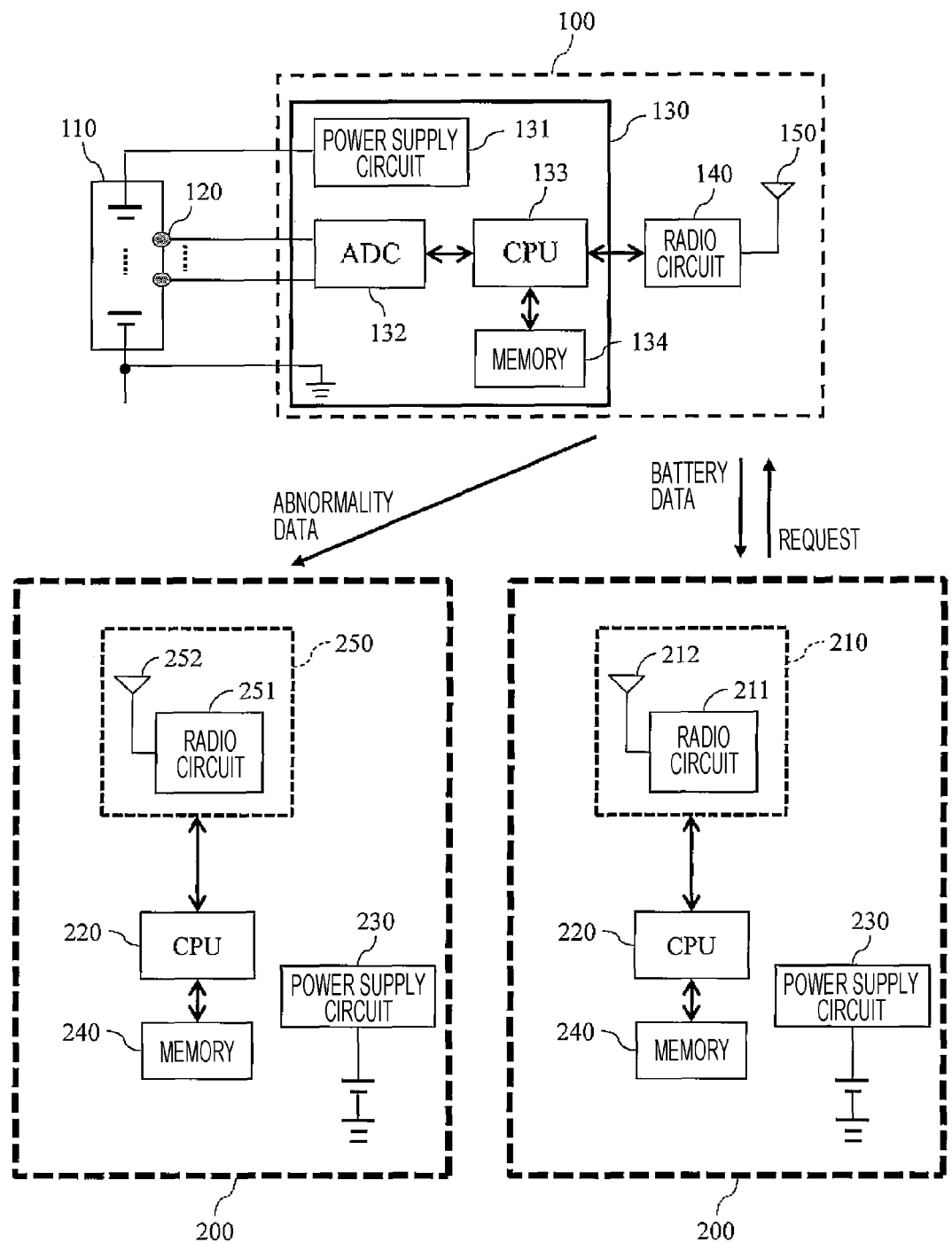
FIG. 9 is a diagram illustrating a configuration of respective devices provided in the battery system 1000 according to a fourth embodiment.

FIG. 9 is a diagram illustrating a configuration of the respective devices provided in the battery system 1000 according to a fourth embodiment of the invention. In the first to third embodiments, the description has been made about that the battery system controller 200 is provided with the transmission/reception circuits 210 and 250. However, as illustrated in FIG. 9, two battery system controllers 200 may be configured such that one is provided only with the transmission/reception circuit 210, and the other one is provided only with the transmission/reception circuit 250. The other configurations of each battery system controller 200 are the same as those of the first to third embodiments.

In this fourth embodiment, the function served by the single battery system controller 200 in the first to third embodiments is shared by the battery system controller 200 using the frequency F1 and the battery system controller 200 using the frequency F2. The battery data or the abnormality data acquired by both controllers is transmitted to the host vehicle control controller 310. Therefore, it is possible to realize the same function as that of the first to third embodiments.

As illustrated in FIG. 9, the battery management device 100 and the respective battery system controllers 200 are similar in configuration. In other words, both devices are common in that the radio circuit, the CPU, the memory, and the power supply circuit are provided. Therefore, for example, the battery management device 100 and the respective battery system controller 200 may be configured using the same assembled control device, and only a logical function such as a program executed by each CPU is installed according to the function of each device. Therefore, the circuit configuration is commonized, so that the cost can be suppressed.

The invention is not limited to the above embodiments, and various modifications can be included. The above embodiments are provided to describe the invention in detail for the sake of easy understanding. The invention is not necessarily limited to the configuration equipped with all the devices. In addition, some configurations of a certain embodiment may be exchanged with the configurations of another embodiment. In addition, the configurations of the other embodiment may be added to those of a certain embodiment. Additions, omissions, and substitutions may be made in some configurations of each embodiment.

Some of the respective configurations, functions, processing units, and processing means may be realized in hardware such as an integrated circuit. In addition, the respective configurations and functions may be realized in software such that a processor analyzes and executes a program which realizes the respective functions. The information of the program for realizing the respective functions, a table, and a file may be stored in a recording device such as a memory, a hard disk, and an SSD (Solid State Drive), and a recording medium such as an IC card, an SD card, and a DVD.

REFERENCE SIGNS LIST 100 battery management device
120 sensor
130 calculation unit
140 radio circuit
150 antenna
200 battery system controller
210 and 250 transmission/reception circuit
220 processor
230 power supply circuit
240 memory
310 vehicle control controller
320 relay switch
330 inverter
340 motor
1000 battery system

The invention claimed is:

1. A battery control system comprising:
a battery management device which manages a status of a battery; and
a battery system controller which receives, from the battery management device, battery data describing a status of the battery and abnormality data describing a fact that an abnormality occurs in the battery,
wherein the battery system controller includes first and second communication units which performs radio communication with the battery management device to receive the battery data and the abnormality data,
wherein the first communication unit performs the radio communication with the battery management device using a first frequency at every predetermined period to receive the battery data at the predetermined period,
wherein, when an abnormality occurs in the battery, the second communication unit receives the abnormality data which is transmitted by the battery management device using a second frequency different from the first frequency, and
wherein the first communication unit receives the battery data regardless of whether the second communication unit is receiving the abnormality data, and the second communication unit receives the abnormality data regardless of whether the first communication unit is receiving the battery data.

2. The battery control system according to claim 1,
wherein, in a case where an acknowledgement to the abnormality data is not able to be received from the second communication unit, the battery management device transmits the abnormality data at the predetermined period using the first frequency in place of the second frequency.

3. The battery control system according to claim 1,
wherein the battery control system includes first and second battery management devices, and
wherein the first battery management device confirms whether the second battery management device performs the communication using the second frequency before transmitting the abnormality data, and transmits the abnormality data after confirming that the communication is not performed.

4. The battery control system according to claim 3,
wherein, in a case where the second battery management device is performing the communication using the second frequency, the first battery management device waits for a predetermined period corresponding to a communication time necessary for the second battery management device to transmit the abnormality data, and confirms again whether the second battery management device is performing the communication using the second frequency.

5. The battery control system according to claim 1,
wherein, in a case where an abnormality of the battery is detected at a time which is earlier by a predetermined time interval than a transmission slot time assigned for transmitting the battery data according to the predetermined period and at which a time interval until the transmission slot time comes is shorter than the predetermined period, the battery management device transmits the abnormality data at the predetermined period using the first frequency in place of the second frequency.

6. The battery control system according to claim 1,
wherein the battery system controller is configured to transmit a command, the command requesting the battery management device to transmit the battery data, at a time slot which is assigned in advance according to the predetermined period,
wherein the battery management device is configured to transmit the battery data according to the command, and
wherein, in a case where a period necessary for transmitting the abnormality data is overlapped in time with the time slot necessary for the battery system controller to transmit the command, the battery management device transmits the abnormality data at the predetermined period using the first frequency in place of the second frequency.

7. The battery control system according to claim 6,
wherein the battery control system includes first and second battery management devices,
wherein, in a case where the period necessary for transmitting the abnormality data is overlapped in time with the time slot necessary for the battery system controller to transmit the command, the first battery management device transmits the abnormality data at the predetermined period using the first frequency in place of the second frequency, and
wherein the second battery management device transmits the abnormality data using the second frequency while avoiding the time slot necessary for the battery system controller to transmit the command.

8. The battery control system according to claim 7,
wherein the second battery management device confirms whether the first battery management device is performing the communication using the second frequency before transmitting the abnormality data using the second frequency while avoiding the time slot, and transmits the abnormality data after it is confirmed that the communication is not being performed.

9. The battery control system according to claim 1,
wherein the battery management device includes:
a first radio circuit which transmits the battery data and the abnormality data through radio communication;
a first calculation unit which controls an operation of the first radio circuit; and
a first power supply circuit which supplies power to the first radio circuit and the first calculation unit,
wherein the battery system controller includes:
a second radio circuit which performs radio communication with respect to the first radio circuit;
a second calculation unit which controls an operation of the second radio circuit; and
a second power supply circuit which supplies power to the second radio circuit and the second calculation unit, and
wherein the battery system controller is configured to be divided into a first battery system controller which includes the second radio circuit serving as the first communication unit and a second battery system controller which includes the second radio circuit serving as the second communication unit.

10. The battery control system according to claim 1,
wherein the battery system controller is connected to a vehicle control controller which controls an operation of a vehicle, and
wherein, when receiving the abnormality data from the battery management device, the battery system controller notifies the fact to the vehicle control controller, and controls a voltage or a current of the battery according to an instruction from the vehicle control controller corresponding to the notification.

11. A battery system comprising:
the battery control system according to claim 1; and
a battery which is controlled by the battery control system.

\* \* \* \* \*